United States Patent [19]
Fujino et al.

[11] Patent Number: 5,587,015
[45] Date of Patent: Dec. 24, 1996

[54] APPARATUS FOR PRODUCTION OF SINGLE CRYSTAL OXIDE FILMS BY LIQUID-PHASE EPITAXY

[75] Inventors: Masaru Fujino; Hiroshi Takagi, both of Ohtsu, Japan

[73] Assignee: Murata Manufacturing Co., Ltd., Japan

[21] Appl. No.: 418,012

[22] Filed: Apr. 6, 1995

[30]   Foreign Application Priority Data

Apr. 7, 1994   [JP]   Japan ................................ 6-069402

[51] Int. Cl.$^6$ .................................................. C30B 35/00
[52] U.S. Cl. ............................ 117/200; 117/54; 117/58; 117/202
[58] Field of Search ........................... 117/54, 58, 60, 117/64, 200, 202, 204, 900, 934; 118/726, 727; 204/298.05

[56]         References Cited

U.S. PATENT DOCUMENTS 3,647,578   3/1972   Barnett et al. ..................... 117/934

FOREIGN PATENT DOCUMENTS

| 48-81476 | 10/1973 | Japan. | |
|---|---|---|---|
| 56-029320 | 3/1981 | Japan. | |
| 7095893A | 6/1982 | Japan | 117/60 |
| 2094608A | 4/1990 | Japan | 117/200 |
| 5117095A | 5/1993 | Japan | 117/60 |
| 1472560 | 5/1977 | United Kingdom. | |

OTHER PUBLICATIONS

Applied Physics Letters, vol. 19, No. 11, Dec. 1971 pp. 486–488–Levinstein et al. "Growth of High Quality Garnet Thin Films from Supercooled Melts" p. 487, col. 2, line 10; Fig. 1 and p. 488, col. 1, lines 11–18.
Patent Abstracts Of Japan—vol. 4, No. 130 Sep. 12, 1980.
Journal of Crystal Growth, vol. 64, No. 2, Nov. 1984, pp. 275–284–Kalges et al. "LPE Growth of Bismuth Substituted Gadolinium Iron Garnet Layers: Systematization of Experimental Results"—Fig. 1.

*Primary Examiner*—R. Bruce Breneman
*Assistant Examiner*—Felisa Garrett
*Attorney, Agent, or Firm*—Ostrolenk, Faber, Gerb & Soffen, LLP

[57]           ABSTRACT

An apparatus for production of single crystal oxide films by liquid-phase epitaxy comprises an insulating core tube with an external high frequency heating means, an electroconductive cylindrical member having openings at both ends and being arranged in the core tube, and a crucible made of an electroconductive material and coaxially arranged in the cylindrical member.

15 Claims, 2 Drawing Sheets

APPARATUS FOR PRODUCTION OF SINGLE CRYSTAL OXIDE FILMS BY LIQUID-PHASE EPITAXY

BACKGROUND OF THE INVENTION

1. Field of the Invention

The present invention relates to an apparatus for production of single crystal oxide films by liquid-phase epitaxy and, more particularly, to an apparatus for producing, by liquid phase epitaxy, single crystal oxide films such as magnetic garnet single crystal films suitable for use in magnetostatic-wave devices, and lithium niobate suitable for use in optical devices.

2. Description of the Prior Art

For production of single crystal oxide films by liquid phase epitaxy, there has been used an apparatus having a structure as shown in FIG. 2. This apparatus comprises a vertically arranged core tube 1 of alumina, resistance heaters 2a, 2b and 2c arranged around the core tube 1, a cylindrical furnace body or shell 3 of a heat-insulating material for covering the core tube 1, a shutter 4 for closing an opening of the core tube 1, a platinum crucible 6 for holding raw materials of oxide films, a support 7 for supporting the crucible 6, and a holder 9 of platinum or a platinum alloy connected to a rod 10 for holding a substrate 8 horizontally.

Using the apparatus, a single crystal oxide film, for example, a magnetic garnet film is produced in the following manner. Firstly, oxides of elements constituting a magnetic garnet, i.e., $Fe_2O_3$ and $Y_2O_3$, are charged into a platinum crucible 6 along with PbO and $B_2O_3$ serving as a solvent. After the crucible 6 has been mounted on the support 7 in the core tube 1, the raw material in the crucible 6 is heated to and melted at 1200° C. to prepare a homogenized melt 5. The resultant melt 5 is then cooled to a temperature between liquidus line and solidus line, i.e., about 900° C. and kept at that temperature to convert the melt into a supercooled state.

Then, a substrate 8, generally made of $Gd_3Ga_5O_{12}$ (hereinafter referred to as "GGG") and previously attached to the holder 9, is inserted into the core tube 1 by lowering the supporting rod 10 into the core tube 1 so that the substrate is pre-heated to the atmospheric temperature. After this, the substrate 8 is immersed into the melt 5 and rotated at a fixed level therein for a certain period of time while reversing the direction of rotation periodically. During this step, a single crystal film of magnetic garnet is epitaxially grown on the substrate. Finally, the substrate 8 is drawn up from the melt 5 and rotated above the melt 5 at a high rate of revolution to remove the melt adhered to the epitaxially grown magnetic garnet single crystal film.

In the apparatus of the prior art, however, the heat generated by the resistance heaters is initially consumed to raise the temperature of the core tube 1 and the raw materials in the crucible as they are heated by radiant heat emitted from the core tube. Thus, it takes a long time to prepare the homogenized melt because of the large heat capacity of the apparatus. Similarly, it takes a long time to cool the homogenized melt to the supercooled state because of the large heat capacity of the apparatus. For this reason, spontaneous nucleation takes place during cooling of the melt, causing precipitation of garnet in the melt, which in turn causes a lowering of quality of the single crystal film as the precipitate is taken into the single crystal film during epitaxial growth of the single crystal.

SUMMARY OF THE INVENTION

It is therefore an object of the present invention to provide an apparatus for production of single crystal oxide films by liquid-phase epitaxy, which makes it possible to prevent the melt from formation of spontaneous nucleation as well as to produce single crystal oxide films with good qualities.

According to the present invention the above object is achieved by providing an apparatus for production of single crystal oxide films by liquid-phase epitaxy, comprising an insulating core tube with an external high frequency heating means, an electroconductive cylindrical member having openings at both ends and being arranged in the core tube, and a crucible made of an electroconductive material and coaxially arranged in the cylindrical member.

In a preferred embodiment, the core tube is made of alumina, while the cylindrical member and crucible are of platinum or a platinum alloy.

In another preferred embodiment, the apparatus includes a high frequency induction coil, as the external high frequency heating means, which heats the electroconductive cylindrical member by induction. In this case, the raw materials in the crucible is heated by radiant heat emitted from the cylindrical member. This makes it possible to improve the thermal requirements as the heat capacity of the cylindrical member is considerably smaller than that of the core tube. Thus, the time required for cooling the homogenized melt to the supercooled temperature can be minimized, thus making it possible to minimize spontaneous nucleation during the lowing of temperature to the supercooled temperature, which in turn makes it possible to produce single crystal oxide films with good quality.

The above and other objects, features and advantages of the present invention will become apparent from the detailed description given hereinafter, making reference to the accompanying drawings. However, it should be understood that the detailed description and specific examples, while indicating preferred embodiment of the invention, are given by way of illustration only, since various changes and modifications within the spirit and scope of the invention will become apparent to those skilled in the art from this detailed description.

DETAILED DESCRIPTION OF THE PREFERRED EMBODIMENT

Figure 1:
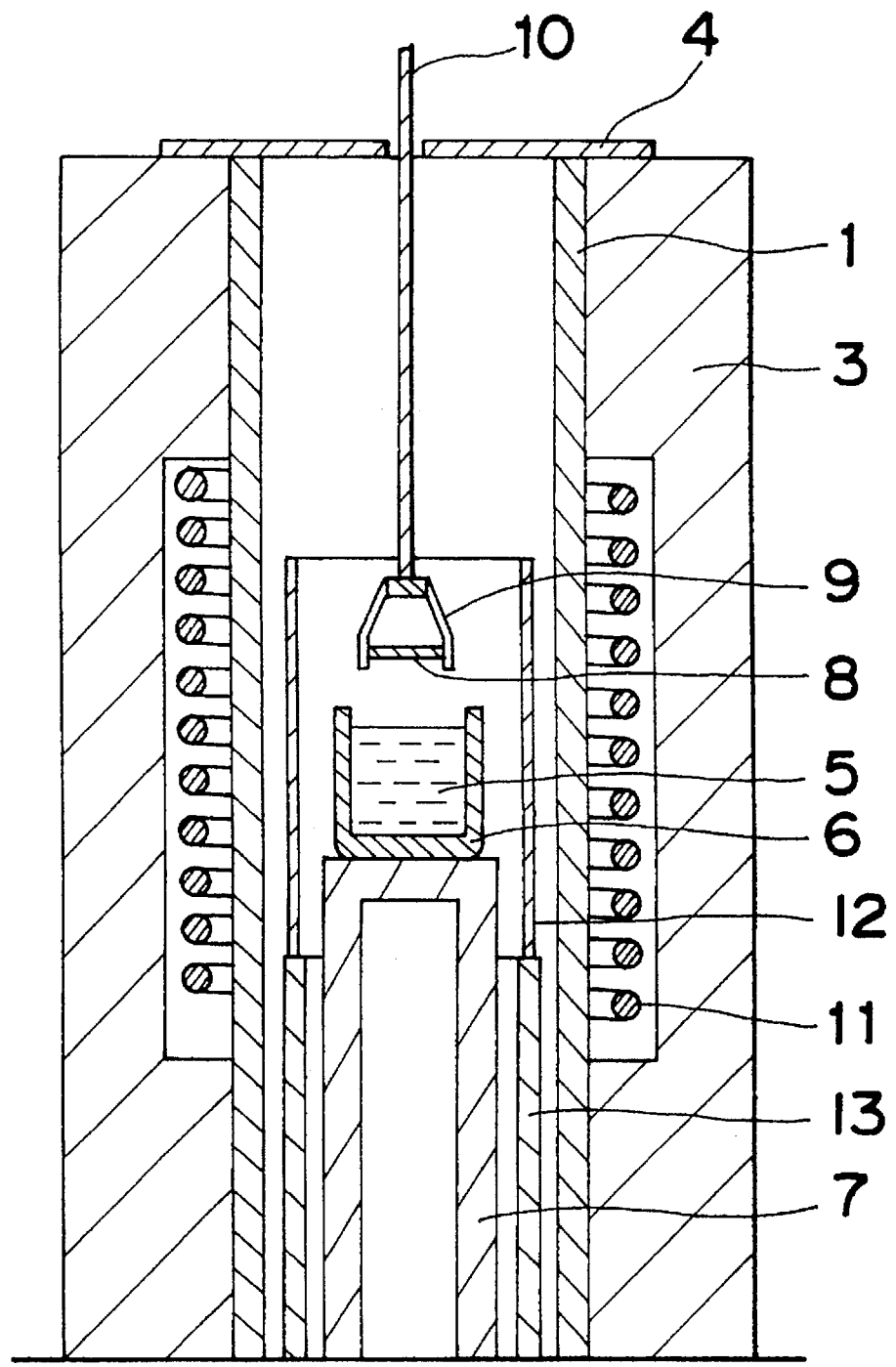
FIG. 1 is a schematic sectional view illustrating an apparatus of the present invention for production of single crystal oxide films by liquid-phase epitaxy.

Referring now to FIG. 1, there is shown an apparatus of the present invention for producing single crystal oxide films by liquid-phase epitaxy, which generally comprises an insulating core tube 1, a high frequency induction coil 11 wound around the core tube 1, a cylindrical furnace body or a cylindrical shell 3 surrounding the core tube 1, and a cylindrical member 12 coaxially arranged in the core tube 1.

The core tube 1 is made of an insulating material and arranged vertically. The cylindrical member 12 is made of platinum in the form of a short round body having openings at both ends. This cylindrical member 12 is mounted on a cylindrical support 13 of platinum and arranged coaxially with the core tube 1, while a crucible 6 of platinum is mounted on a support 7 and arranged coaxially with the cylindrical member 12. The remaining parts of the apparatus are similar to those of the apparatus shown in FIG. 2 so that like parts are designated by like reference numerals to avoid repeated explanation.

Figure 2:
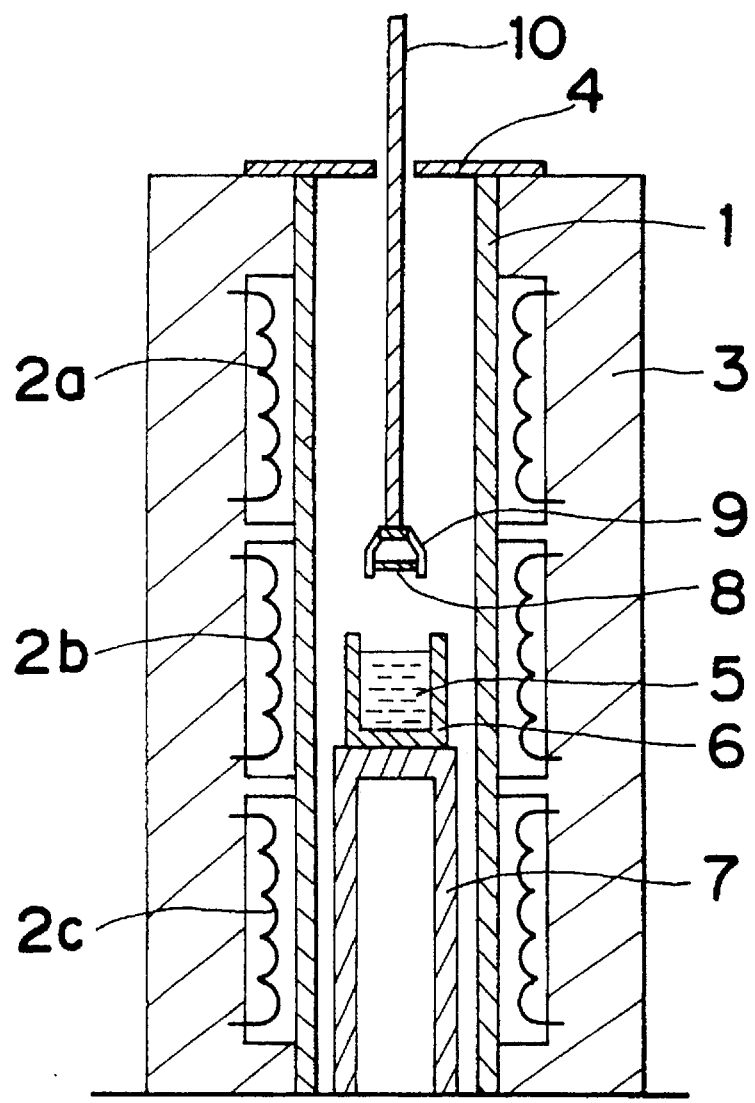
FIG. 2 is a schematic sectional view of an apparatus of the prior art for production of single crystal oxide films by liquid-phase epitaxy.

For the apparatus of the present invention shown in FIG. 1 and the apparatus of the prior art shown in FIG. 2 both including the core tube with the same inner diameter, measurements were made on the maximum temperature-raising rate and maximum temperature-lowering rate. Results are shown in Table 1.

TABLE 1

| Apparatus | Maximum heating rate (°C./min) | Maximum cooling rate (°C./min) |
|---|---|---|
| Invention | 70 | 10 |
| Prior art | 14 | 5 |

From the results shown in Table 1, it is clear that the apparatus of the present invention, compared with the apparatus of the prior art, is considerably improved in maximum temperature-raising rate and maximum temperature-lowering rate and possesses a good temperature responsibility.

Using the above apparatus, magnetic garnet films were prepared in the follow manner. Firstly, powders of $Fe_2O_3$ and $Y_2O_3$, which are oxides of elements constituting a magnetic garnet, were charged into a platinum crucible 6 along with powders of PbO and $B_2O_3$ which serve as a solvent. After mounting the crucible 6 on a support 7, a high frequency electric power was supplied to the induction coil 11 so that the platinum cylindrical member 12 is heated to about 1200° C. by induction heating. The raw materials in the crucible 6 were heated by radiant heat emitted from the cylindrical member 12, thereby producing a homogenized melt 5. Then, the melt was cooled to and maintained at a temperature between the liquidus line and solidus line, i.e., about 900° C. to convert the melt 5 into a supercooled state. A GGG substrate 8 previously attached to a holder 9 was inserted into the cylindrical member 12 by lowering a supporting rod 10, whereby pre-heating the GGG substrate 8 by the radiant heat from the cylindrical member 12. The GGG substrate 8 was then immersed into the melt 5 and rotated at a fixed level therein for a certain period of time, while reversing the direction of rotation periodically, to introduce epitaxial growth of a magnetic garnet single crystal film. Finally, the substrate 8 was drawn up from the melt 5 and rotated above the melt 5 at a high rate of revolution to remove the melt adhered thereto.

For the resultant single crystal film, the number of pits within the film was counted to determine defect density. The result is shown in Table 2 along with the result for the single crystal film produced by using the apparatus of the prior art as shown in FIG. 2 with the core tube having the same inner diameter as that of the apparatus of the present invention.

TABLE 2

| Apparatus | Density of defects (pits/cm$^2$) |
|---|---|
| Invention | 5 |
| Prior art | 158 |

As can be seen from the results shown in Table 2, the defect density of the magnetic garnet film produced by the apparatus of the prior art is 158 pits/cm$^2$, while that of the present invention is reduced to only 5 pits/cm$^2$. Accordingly, the apparatus of the present invention makes it possible to produce magnetic garnet films with good quality.

In the above embodiment, alumina has been used as a material for the core tube, but the core tube is not limited thereto. A core tube made of an electrically insulating material such as zirconia may be used instead of alumina core tube.

Further, the crucible of platinum has been used in the above embodiment, but it is to be understood that the crucible is not limited thereto. Any other materials which does not react with the raw materials for oxide films, for example, platinum alloys may be used as a material for the crucible.

Also, the cylindrical member used in the above embodiment is of platinum, but it is to be understood that any electroconductive material may be used as a material for the cylindrical member. Among them, the most preferred material is platinum or platinum alloy as these materials are stable even in an oxidizing atmosphere used for production of single crystal oxide films by epitaxy. Further, it is preferred to arrange the cylindrical member coaxial with the crucible so that the distance from the inner surface of the cylindrical member to the outer surface of the crucible is kept constant to heat the raw material uniformly.

In the above embodiment, the apparatus of the present invention is applied to production of magnetic garnet single crystal films. However, it is to be understood that the apparatus of the present invention can be applied to production of a variety of other single crystal oxide films such as lithium niobate single crystal films useful as a material for optical devices.

What is claimed is:

1. An apparatus for production of single crystal oxide films by liquid-phase epitaxy comprising an insulating core tube, an electroconductive cylindrical member having openings at both ends and being arranged in the core tube, a high frequency induction heater disposed outside said core tube for heating said electroconductive cylindrical member and a crucible made of an electroconductive material and coaxially arranged in the cylindrical member.

2. The apparatus according to claim 1 wherein the core tube is of alumina, while the cylindrical member and crucible are of platinum or a platinum alloy.

3. The apparatus according to claim 2, wherein the external high frequency heater is a high frequency induction coil.

4. The apparatus according to claim 1, wherein the external high frequency heater is a high frequency induction coil.

5. An apparatus for production of a single crystal oxide film by liquid-phase epitaxy, comprising:

an insulating core tube;

an electroconductive cylindrical member arranged in the core tube;

a high frequency induction heater disposed outside said insulating core tube for heating said electroconductive cylindrical member; and a liquid phase epitaxy crucible for holding a raw material of the single crystal oxide film arranged in the cylindrical member and heated by radiant heat emitted from said cylindrical member.

6. The apparatus according to claim 5, in which the crucible is coaxially arranged in the cylindrical member.

7. The apparatus according to claim 6, in which the crucible is made of an electroconductive material.

8. The apparatus according to claim 7, in which the electroconductive material is platinum or a platinum alloy.

9. The apparatus according to claim 8, in which the insulating core tube is made of aluminum or zirconia.

10. The apparatus according to claim 9, in which the high frequency heater is operatively connected to a source of high frequency.

11. The apparatus according to claim 5, in which the crucible is made of an electroconductive material.

12. The apparatus according to claim 11, in which said electroconductive cylindrical member is made of platinum or a platinum alloy.

13. The apparatus according to claim 5, in which said electroconductive cylindrical member is made of platinum or a platinum alloy.

14. The apparatus according to claim 5, in which said insulating core tube is made of aluminum or zirconia.

15. The apparatus according to claim 5, in which the high frequency coil is operatively connected to a source of high frequency.

\* \* \* \* \*